United States Patent
Jacquet

(10) Patent No.: US 6,822,981 B2
(45) Date of Patent: Nov. 23, 2004

(54) LASER THAT CAN BE TUNED QUICKLY OVER A WIDE BAND

(75) Inventor: Joël Jacquet, Limours (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/079,875

(22) Filed: Feb. 22, 2002

(65) Prior Publication Data

US 2002/0118711 A1 Aug. 29, 2002

(30) Foreign Application Priority Data

Feb. 23, 2001 (FR) .............................. 01 02490

(51) Int. Cl.[7] .................................................. H01S 3/10
(52) U.S. Cl. .......................................... 372/20; 372/9
(58) Field of Search .............................. 372/20, 26, 25, 372/32, 9, 6, 50, 102; 385/16; 359/344

(56) References Cited

U.S. PATENT DOCUMENTS

| | | | | |
|---|---|---|---|---|
| 4,975,918 A | * | 12/1990 | Morton ......................... | 372/20 |
| 5,184,247 A | * | 2/1993 | Schimpe ...................... | 359/344 |
| 5,539,571 A | * | 7/1996 | Welch et al. ................ | 359/344 |
| 5,699,378 A | * | 12/1997 | Lealman et al. ............ | 372/102 |
| 5,793,521 A | * | 8/1998 | O'Brien et al. ............. | 359/344 |
| 6,031,860 A | * | 2/2000 | Nitta et al. .................... | 372/50 |
| 6,088,373 A | | 7/2000 | Hakki | |
| 6,263,002 B1 | * | 7/2001 | Hsu et al. ..................... | 372/6 |
| 6,349,106 B1 | * | 2/2002 | Coldren ......................... | 372/50 |
| 6,490,381 B1 | * | 12/2002 | Adair et al. .................. | 385/16 |

FOREIGN PATENT DOCUMENTS

| | | |
|---|---|---|
| EP | 0 300 790 A2 | 1/1989 |
| WO | WO 00/22705 | 4/2000 |

OTHER PUBLICATIONS

J. F. Lemieux et al, Step–tunable (100 GHz) hybrid laser based on Vernier effect between Fabry–Perot cavity and sampled fibre Bragg grating, Electronics Letters, IEE Stevenage, GB, vol. 35, No. 11, May 27, 1999, pp. 904–906, XP006012176.

P. A. Morton et al "Stable Single Mode Hybrid laser with High Power and Narrow Linewidth", Applied Physics Letters, American Institute of Physics, NY, US, vol. 64, No. 20, May 16, 1994, pp. 2634–2636, XP000449693.

\* cited by examiner

*Primary Examiner*—Don Wong
*Assistant Examiner*—Tuan N. Nguyen
(74) *Attorney, Agent, or Firm*—Moser, Patterson & Sheridan, L.L.P.

(57) ABSTRACT

A wavelength-tunable laser consists of a resonant semiconductor cavity coupled to a sampled Bragg reflector grating having reflectivity peaks for N optical frequencies. The resonant cavity is formed of two opposite reflector members that are not wavelength selective and delimit an amplifier section coupled to a phase tuning section. The optical length of the cavity is adjustable electro-optically as a function of a control voltage applied to it. The laser can be tuned quickly over a wide band.

16 Claims, 3 Drawing Sheets

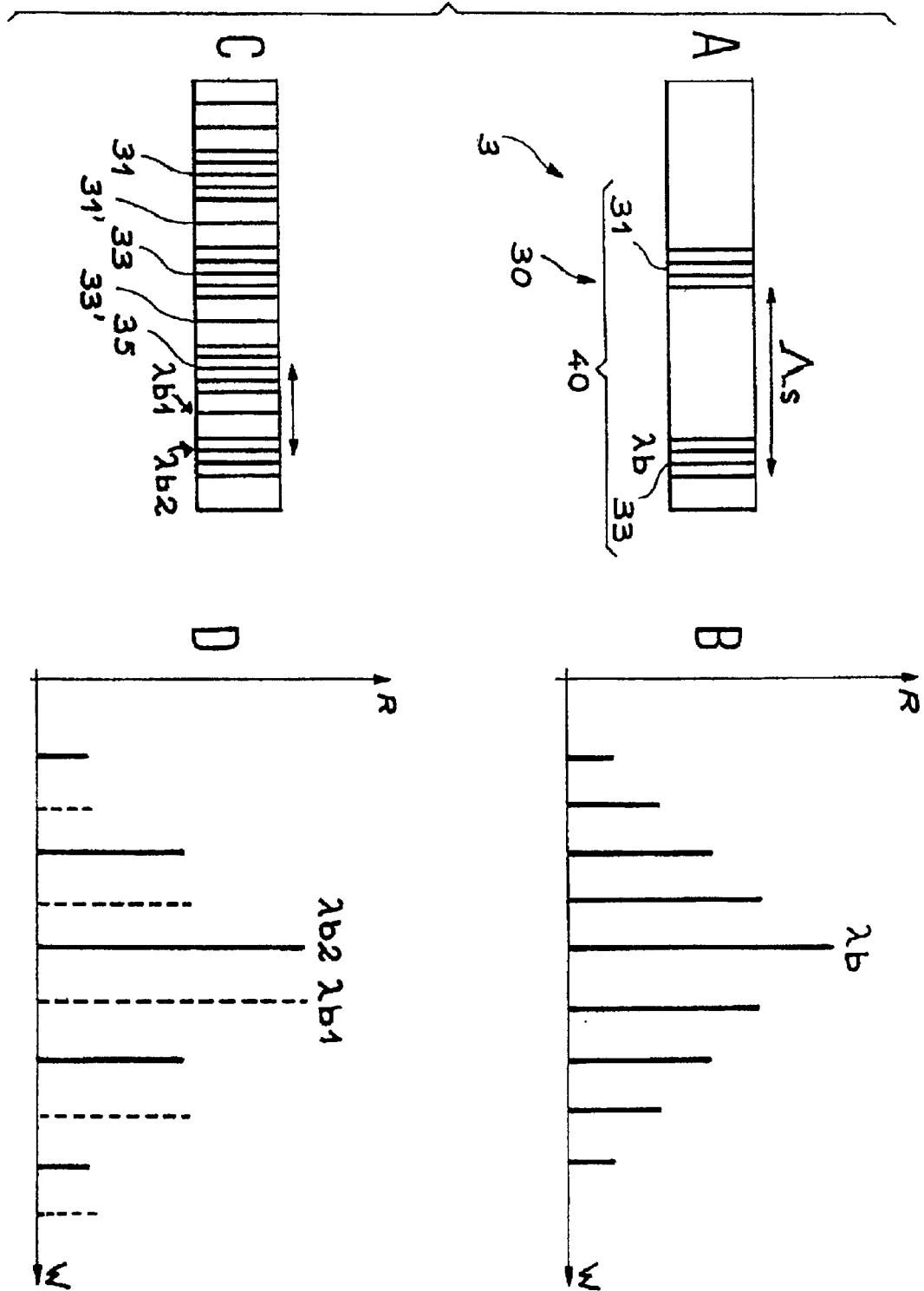

LASER THAT CAN BE TUNED QUICKLY OVER A WIDE BAND

CROSS-REFERENCE TO RELATED APPLICATIONS

This application is based on French Patent Application No. 01 02 490 filed Feb. 23, 2001, the disclosure of which is hereby incorporated by reference thereto in its entirety, and the priority of which is hereby claimed under 35 U.S.C. §119.

BACKGROUND OF THE INVENTION

1. Field of the Invention

The invention relates to lasers whose emission wavelength can be varied, which are referred to as tunable lasers. Tunable lasers have been found to be particularly beneficial in optical telecommunication systems using wavelength division multiplexing.

2. Description of the Prior Art

Lasers whose wavelength can be adjusted are already known in the art. Document [1] (see the bibliography at the end of this description), describes a distributed Bragg reflector tunable laser. The laser system includes an amplifier section placed end-to-end with a Bragg section to which an adjustment voltage is applied to tune the laser. Two wavelength adjustment mechanisms have been observed with this laser. One is based on the standard injection of current into the Bragg section and the other is based on the application of a reverse bias voltage to adjust the refractive index electro-optically. The total tuning range of the laser including these two mechanisms about a wavelength of 1.56 µm is approximately 120 angstrom units with 31 modes regularly spaced by 3.5 angstrom units. Of these modes, 25 are obtained by forward biasing the Bragg section (current injection) with a voltage variation of 1.6 volts and six others are obtained by reverse biasing the same section (electro-optical effect) with a voltage variation of 4 volts. With a system of the above kind subject to an electro-optical effect, it has been possible to obtain switching times between two wavelengths of 500 ps, independently of the difference between the switched wavelengths. These switching times are increased to several nanoseconds in the case of current injection.

The tunable lasers most widely used at this time are lasers which can be tuned by injecting a current. The minimum time-delay to obtain tuning is imposed by the lifetime of the carriers in the tuning section, however. According to document [1], short time-delays of 500 picoseconds have been obtained using electro-optical effects. This relatively high speed is achieved at the expense of the tuning range, which according to document [1] is restricted to 25 angstrom units.

A laser that can be tuned using a different principle is described in document [2], which describes a laser in which stepwise tuning is obtained by means of an external cavity delimited by a fiber incorporating a sampled Bragg grating. The laser system shown in FIG. 1 of document [2] includes a laser diode forming a Fabry-Pérot cavity. The laser diode is coupled to an optical fiber including the sampled Bragg grating, which has eight main reflection peaks. The front face of the diode, facing the fiber, includes an anti-reflection layer producing a reflection coefficient of $5 \times 10^{-3}$. The resulting laser device operates in a single mode for each of the wavelengths corresponding to a reflection peak of the Bragg grating of the fiber. Monomode operation is possible because of the low reflectivity of the front face, enabling the use of a thin Fabry-Pérot cavity having a free spectrum gap of 103 GHz. The gain condition is met if a residual mode of the Fabry-Pérot cavity has a wavelength coinciding with one of the wavelengths corresponding to a reflection peak of the fiber. Document [2] explains that the device has been used to produce a laser device whose optical emission frequency can be adjusted in steps of 100 GHz, for wavelengths from 1551.09 nm to 1556.66 nm, i.e. a spacing between extreme tuning wavelengths of approximately 6 nm. The wavelength is changed by varying the current injected into the gain medium of the laser diode. A wide range of tuning wavelengths implies injecting high currents and consequently a large variation in emission power. Also, the adjustment obtained by index variation is mainly associated with heating of the structure, so the effect and therefore tunability will be very slow (ms).

Compared to the prior art just described, the invention proposes a tunable laser that can be tuned over a wide range of wavelengths, of the order of 100 nm and more, in a simple manner, by acting on a single control parameter, enabling any optical frequency of the International Telecommunication Union (ITU) chart to be obtained precisely, with a small spacing between consecutive frequencies of 50 GHz or 100 GHz. Thus a tunable laser in accordance with the invention can be tuned over a large number of wavelengths.

The invention aims above all to achieve very short tuning time-delays, for use in optical switching in particular.

The invention also aims to provide a tunable laser of improved longevity that can employ simplified controlled electronics. It further aims to produce narrow-band laser emission of great spectral purity and free of noise.

SUMMARY OF THE INVENTION

To be more precise, the invention provides a wavelength-tunable laser including a first resonant cavity containing an optical amplifier medium and a reflector external to the first cavity, delimiting a second cavity, and having reflectivity peaks for an integer number N of optical frequencies, in which laser the first cavity is formed of two opposed reflector members that are not wavelength selective and delimit an amplifying first active section coupled to a phase tuning second active section, each of the two active sections is adapted to be connected to its own electrical supply, the second active section has an effective group index that can be adjusted electro-optically as a function of an electrical voltage applied to it, and the first and second active sections have dimensions such that the difference between the optical frequencies of any two resonant modes of the first cavity is never equal to the difference between the optical frequencies of any two reflectivity peaks of the reflector.

Accordingly, a current injected into the first section defines the gain of the first cavity. Also, because the first cavity is delimited by reflective members that are not wavelength selective, the cavity is a true Fabry-Pérot cavity. The difference between the frequencies of any two adjacent resonant modes is then practically constant, and is imposed essentially by the compositions and dimensions of the members constituting the first cavity. Varying the voltage applied to the second section causes the comb of resonant frequencies of the cavity to slip. The adjustment of these resonant frequencies is the result of an electro-optical effect: the reverse electric field applied through the PIN structure of the phase tuning section imposes a corresponding value of the index of its active layer and therefore of the effective group index of the structure. Depending on the structure chosen, the operative electro-optical effect can be the Franz-Keldysh effect or the Stark quantum confinement effect. Accordingly, the optical length of the first cavity can be modified as a function of the applied voltage, which is what causes the comb of resonant frequencies to slip.

Because the reflector returns toward the first cavity a portion of the light that it emits, and because the first cavity is designed so that the difference between the optical frequencies of any two resonant modes is never equal to the difference between the optical frequencies of any two reflectivity peaks of the reflector, simply adjusting the voltage achieves selective coincidence of only one of the frequencies corresponding to the reflectivity peaks with one of the resonant frequencies of the first cavity, and it is with this single coincident frequency that the laser oscillation of the system occurs.

An external reflector having N reflectivity peaks can be produced by means of a sampled Bragg grating waveguide, as described in document [2] already cited. The grating can consist of a series of samples of constant pitch, regularly spaced along the guide, in which case the coefficients of reflectivity of the peaks as a function of frequency will decrease within an envelope of sine cardinal shape from a center frequency corresponding to the Bragg frequency of the grating. Each sample can also, and preferably, be produced with an index profile along the guide conforming to a sine cardinal function, and this produces reflectivity coefficients of the same value, within a rectangular envelope. This latter embodiment is advantageous in that the laser threshold current condition is the same for all the reflectivity peaks. The current injected into the first section can then remain constant, and adjustments are facilitated. For more details of the design of sampled Bragg gratings, see document [4].

In the particular instance, which is important in practice, where the difference between any two adjacent optical frequencies of reflectivity peaks is constant, the optical frequencies of the reflectivity peaks are advantageously interleaved with consecutive optical frequencies of resonant modes. This feature, still obtained by appropriately dimensioning the first and second active sections, provides adjustment ranges in which the selected frequency (or wavelength) is a monotonous function of the applied voltage. This simplifies voltage control.

In this latter case, the ratio of the difference between two adjacent optical frequencies of two resonant modes to the difference between two adjacent optical frequencies of reflectivity peaks is preferably made equal to N/(N-1). This ensures that the change from one selected frequency to the next is effected by slipping of the comb of resonant modes by a constant pitch. This results in identical selectivity over the whole adjustment range.

In a preferred embodiment, the external reflector is a waveguide including at least one sampled Bragg reflector grating optically coupled to the first cavity.

The sampled Bragg grating waveguide can be a sampled Bragg grating fiber or any other kind of waveguide, in particular a silica or polymer-based planar guide.

Embodiments of the present invention are further described hereinafter with reference to the accompanying drawings.

BRIEF DESCRIPTION OF THE DRAWINGS

FIG. 4 is in four parts A, B, C and D and shows one particular embodiment of a sampled grating that reduces the length of said grating.

DETAILED DESCRIPTION OF THE PREFERRED EMBODIMENT

Figure 1:
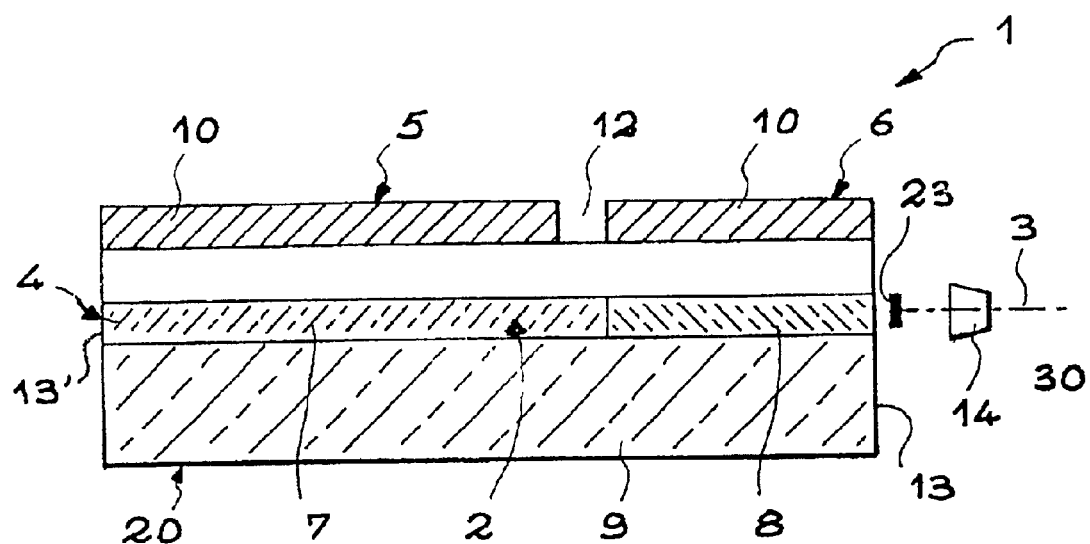
FIG. 1 shows a generalized embodiment of the invention.

FIG. 1 shows a general embodiment of a laser 1 according to the invention.

The laser 1 is essentially formed by a semiconductor laser component 20 coupled to an external reflector symbolized by an axis 3. The component 20 is contained in a first resonant cavity 2. The reflector 3 delimits a second cavity 11 coupled to the first.

The component 20 is formed on a common InP substrate 9, on which is formed an active layer 4 comprising two aligned coupled parts 7, 8. For these two active layer portions 7, 8 to act as guides, they are buried in confinement layers, not identified by reference numbers in the figures. This is known in the art.

The first active layer portion 7 is an amplifier portion. For example, it consists of multiple quantum wells formed by a first epitaxial growth sequence. The second portion 8, formed by a later epitaxial growth step, consists of a medium which has an electro-optical effect, for example the Franz-Keldysh effect.

The two active layer portions 7, 8 define two sections, respectively a gain section 5 and a phase section 6. To this end, a metalized surface contact layer 10 is situated above the confinement layers. The two sections 5, 6 are then electrically separated by an etching 12 effected in the contact layer 10 and in a portion of the confinement layer situated on top of the active layer 4. In addition to a bottom electrode, not shown, the sections 5, 6 therefore have independent top electrodes respectively adapted to receive a carrier injection current and a control voltage. The optical length of the first cavity 2 can be changed by the control voltage without significantly affecting the power emitted by the semiconductor laser 20.

Figure 3:
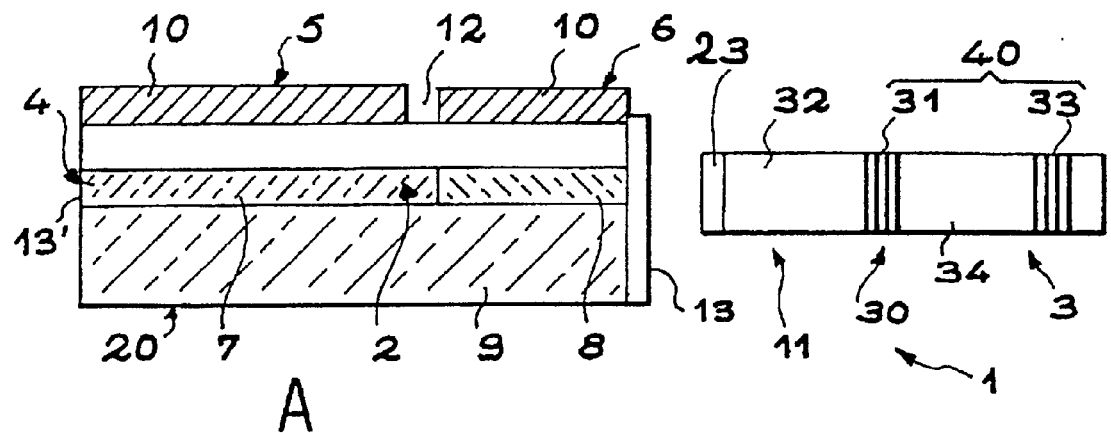
FIG. 3 is in three parts A, B and C and shows different embodiments of and forms of coupling between the sampled Bragg grating waveguide and the first cavity.
Figure 3:
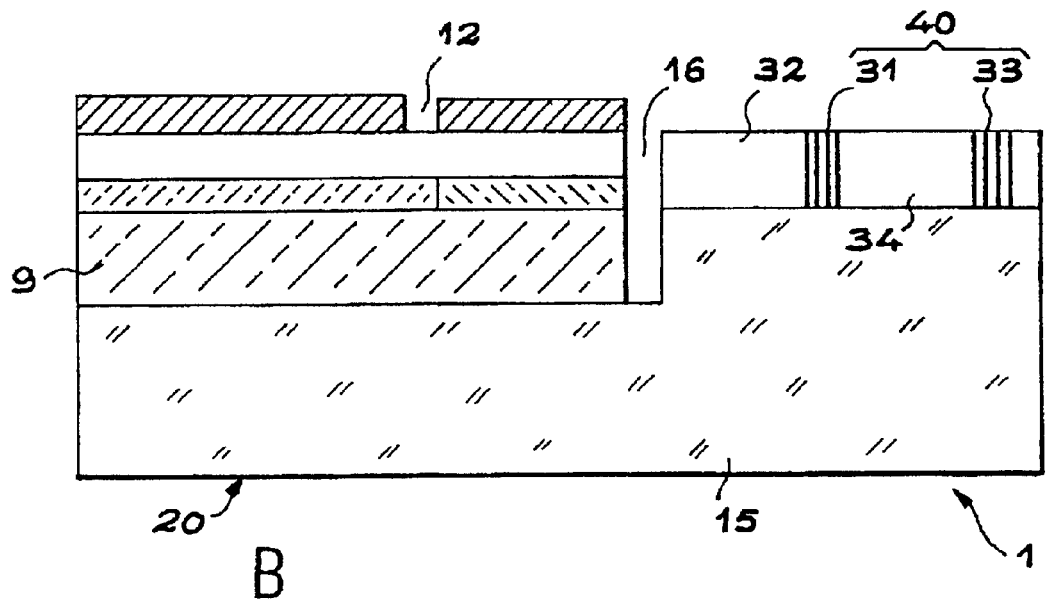
Figure 3:
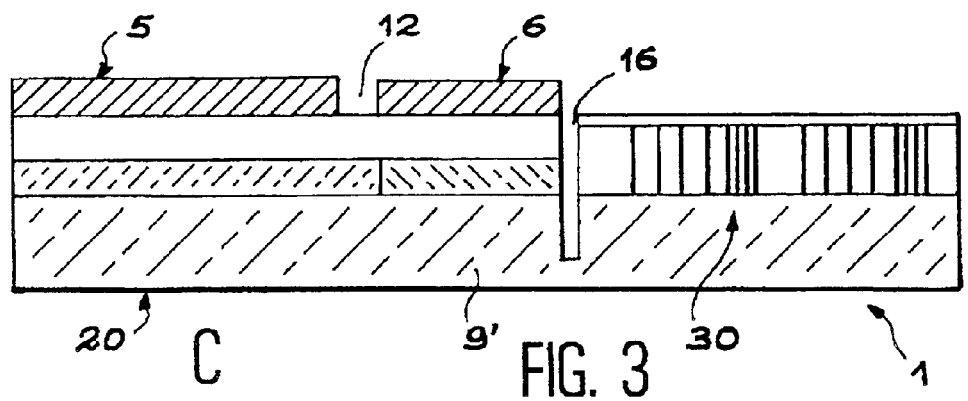

As shown in more detail in FIG. 3, the reflector 3 can take the form of a waveguide 30, such as an optical fiber, in which a sampled Bragg grating 40 is written. This kind of reflector consists of an alternation of distributed Bragg reflector samples 31, 33, etc and Fabry-Pérot sections 32, 34, etc. each consisting of a uniform waveguide portion with no Bragg grating. As explained later, in an advantageous embodiment, enabling the total length of the waveguide portion carrying the sampled Bragg grating to be reduced, a plurality of sampled gratings can be interleaved on the same guide portion. In this case the sections 32, 34, etc. have no Bragg grating at the same wavelength. The whole of the sampled grating is intended to produce a comb of reflectivity peaks, each peak corresponding to a wavelength to which the laser 1 can be tuned.

In a first embodiment, the first cavity 2 is formed between a reflective rear face 13' of the component 20 and its front face 13, which is treated to constitute a semi-reflecting mirror. The first cavity 2 is then delimited by the outside face 13' of the first section 5 and the outside face 13 of the second section 6.

In this first embodiment, the reflection coefficient R2 of the entry face 23 of the waveguide 30, which is a lens-shaped fiber end, for example, must be as small as possible, to prevent deformation of a third cavity. The distance between the front face 13 of the component 20 and the entry face 23 of the fiber 30 can be of the order of several tens of microns. This distance must be taken into account when calculating the phase difference of the wave reflected by the reflector 3.

In a second embodiment the cavity 2 is advantageously defined between the reflective rear face 13' and the entry face 23 of the waveguide 30. To this end, the entry face 23 constitutes a semi-reflecting mirror. In this case, the front face 13 of the active layer 4 must have the lowest possible reflectivity to prevent unwanted reflections and thereby creation of a supplementary cavity. A low reflectivity can be obtained by depositing an anti-reflection dielectric and/or by inclining the optical waveguide formed by the active layer 4 to the direction orthogonal to the cleaving plane of the facet 13. In this embodiment the first cavity 2 is therefore delimited by the first outside face 13' of the first section 5 and the entry face 23 of the waveguide 30 forming the reflector 3.

Figure 2:
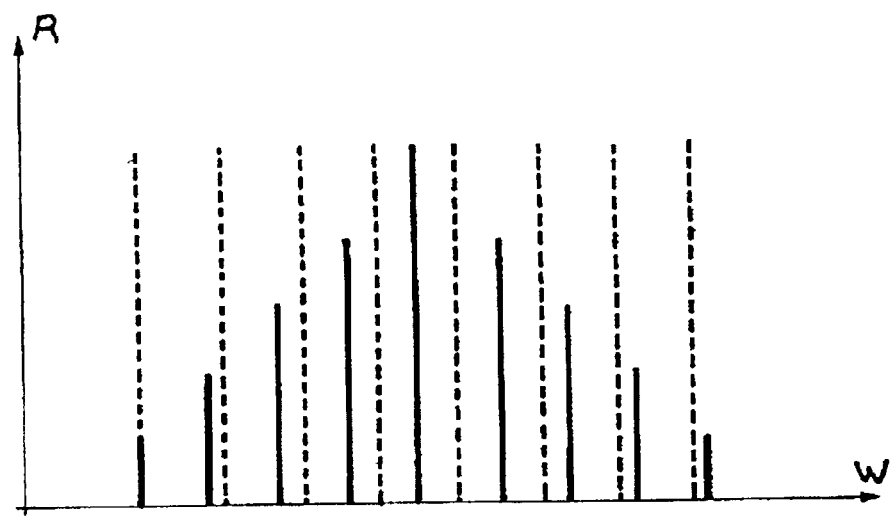
FIG. 2 shows the interleaving of resonant frequencies of the first cavity and frequencies of the reflectivity peaks of the external reflector.

FIG. 2 shows in dashed line one example of the spacing and interleaving of the optical frequencies of the modes of operation of the first cavity 2 and in solid line optical frequencies corresponding to the N reflectivity peaks (where N=9) of the reflector 3. The optical frequencies W are plotted on the horizontal axis and the relative values of the reflectivity coefficients R of the reflectivity peaks are plotted on the vertical axis. In this example, the difference between any two adjacent optical frequencies of reflectivity peaks is constant.

In the absence of perfect tuning between the two cavities, the optical frequencies of the reflectivity peaks alternate with optical frequencies corresponding to resonant modes of the first cavity 2, so that a single optical frequency corresponding to one resonant mode of the first cavity 2 is present in each interval between two consecutive optical frequencies of reflectivity peaks of the reflector 3. In other words, the optical frequencies of the reflectivity peaks are interleaved with consecutive optical frequencies of resonant modes.

Also, the cavity has been chosen so that there is a difference between two adjacent optical frequencies of two resonant modes such that the ratio of this difference to the difference between two adjacent optical frequencies of reflectivity peaks is equal to N/(N−1).

Accordingly, changing the control voltage applied to the second section 6 changes the optical index of the second portion 8 of the active layer 4, and thus its optical length. This causes the resonant comb of the first cavity to slip, so passing from a first mode of operation in which the laser 1 emits at one of the optical frequencies corresponding to a first reflectivity peak of the reflector 3 to a second mode of operation in which the laser 1 emits at another of the optical frequencies corresponding to a second reflectivity peak of the reflector 3.

Details are given below of the orders of magnitude that apply to the invention. The explanation refers not only to optical frequencies but also to corresponding wavelengths (in a vacuum), the more usual terminology in the field of optical components.

If L1 and n1 respectively denote the length and the effective group index of the first portion 7 of the active layer 4, and L2 and n2 respectively denote the length and the effective group index of the second portion 8 of that active layer, the spacing or pitch of the resonant modes of the first cavity 2 is given by the equation:

$$\Delta\lambda = \lambda^2/2(n1L1+n2L2) \qquad (1)$$

in which $\Delta\lambda$ represents the spacing between two consecutive resonant wavelengths of the cavity 2.

For values of n1 and n2 close to 3.2, and for wavelengths within the ITU chart, for 40 channels with a spacing of 100 GHz between consecutive channels, a cavity 2 is obtained providing at most 39 resonant modes in this range of optical frequencies. The length L1+L2 of the cavity is then close to 460 μm. With a spacing of 50 GHz this length would be approximately 920 μm.

The variation $\Delta n2$ in the effective index as a function of the wavelength $\lambda$ and the length L2 of the second portion 8 of the active layer 4 necessary to cover this range of optical frequencies is given by the following equation:

$$\Delta n2 = \lambda/(2L2) \qquad (2)$$

Because the variation that can be obtained by the Franz-Keldysh effect is $\Delta n2=5\times10^{-3}$, a length L2 of the phase section 6 of 150 μm is obtained. To cover 40 channels with a spacing of 100 GHz or 50 GHz between consecutive channels, the active section 5 must then have a length L1 of approximately 300 μm or 770 μm, respectively.

These lengths L1 and L2 are compatible with a high emission power and a narrow bandwidth. It is nevertheless possible to improve the vertical structure of the layers constituting the second section to obtain a greater index variation, which reduces the length L2 and correlatively increases the length L1. A high emission power can then be obtained. To obtain improved control or greater modal selectivity of the first cavity 2, it may be beneficial to have a greater spacing between the resonant wavelengths. This will be achieved by reducing the length L1+L2 of the cavity.

The number of resonant frequencies of the Fabry-Pérot cavity 2 within the range of use of the cavity is determined by the length L1+L2 of the cavity. The accuracy of the spacing between consecutive channels depends on the accuracy with which the transverse faces of the cavity are cleaved. That accuracy is generally ±5 μm. The variation d$\Delta\lambda$ of the spacing between consecutive resonant wavelengths as a function of the variation d(L1+L2) of the total length of the cavity 2 is expressed by the following equation:

$$\Delta\lambda = 2.d(L1+L2)(\Delta\lambda/\lambda)^2 \qquad (3)$$

Accordingly, for a spacing of 50 GHz between consecutive channels, the error in the spacing of the resonant frequencies of the cavity 2 is less than 1 GHz. An error this small can easily be compensated by varying the control of the phase control section 6.

This shows that the invention requires no use in the cleaving process of the Vee technological process that is known in the art and improves the accuracy of cleaving from ±5 μm to ±1 μm.

It should also be noted that control of the resonant modes of the second cavity 11 formed with the external waveguide 30 depends on the phase difference introduced into the return wave by the reflector 3. The phase difference introduced is the same for each reflectivity peak and equal to $\pi/2$, for example.

This means that the lasing mode can be controlled identically for each channel, for example by introducing a phase delay at the entry of the waveguide 30, for example in the form of a controlled phase-shift, as symbolized by a square 14 in FIG. 1. As mentioned above, the separation between the first cavity 2 of the laser in the first embodiment and the entry of the guide or fiber 30 can be of the order of several tens of microns. This distance must be allowed for in calculating the phase difference of the wave reflected by the reflector 3. In the second embodiment, in which the cavity 2 is defined between the rear face 13' of the semiconductor laser 20 and the entry 23 of the waveguide 30, there is no supplementary phase-shift to introduce into the calculations.

Particular embodiments of the waveguides 30, the second cavity 11 and the sampled gratings 40 are described next with reference to FIG. 3. Items in FIG. 3 already commented on with reference to FIG. 1 are not described again. FIG. 3 is in three parts A, B and C.

In part A, the sampled grating 40 of distributed Bragg reflectors 31, 32, etc. is produced on a waveguide 30 consisting of an optical fiber. The reflection coefficient R1 of the cleaved face 13 of the active layer 4 facing the optical fiber 30 must be suitable for low threshold currents, high powers and monomode operation.

In part B of FIG. 3, the waveguide 30 is a polymer or silica waveguide. In this case the semiconductor laser 20 and the guide 30 can be mounted on a common substrate 15, for example a silicon substrate, using an auto-alignment technique to align the fiber and the semiconductor laser.

In part C of FIG. 3, the waveguide 30 is an InP waveguide and can be formed on a substrate 9' common to the semiconductor laser 20 and the guide 30.

In parts B and C of FIG. 3, the cavity 2 and the guide 30 can be separated by an etching 16 to form the mirror of the face 13 facing the entry of the guide 30.

Embodiments of the sampled reflector grating 40 are described next with reference to FIG. 4.

As already indicated, the sampled grating 40 consists of alternating samples of distributed Bragg reflector gratings 31, 33, etc. and Fabry-Pérot sections 32, 34, etc., each consisting of a waveguide portion with no Bragg grating samples.

The length Λs of a sampling period formed by adding the length of a Bragg reflector grating sample and the length of a Fabry-Pérot cavity depends on the required spacing for the frequencies corresponding to reflectivity peaks. For example, for a silica or polymer waveguide having an index n of 1.5, the period is 1 mm or 2 mm for spacings of 100 GHz or 50 GHz, respectively. The relationship between the spacing Δλpeak of the wavelengths of the reflectivity peaks, the peak wavelength λ, the index n of the guide and the length Λs of the sampling period is given by the following equation:

$$\Delta\lambda\text{peak}=\lambda^2/(2n.\Lambda s) \quad (4)$$

The number of sampling periods depends on the reflectivity required. It is from 10 to 15, depending on the coupling coefficients of the Bragg gratings 31, 33 (Kappa value) to be obtained and the reflection coefficient to be achieved. This leads to sampled grating lengths of several mm. For a number of periods from 10 to 15, a value of n close to 1.5 and of Δλpeak equal to 1 nanometer (corresponding to a frequency spacing of the order of 100 GHz), Λs is close to 800 μm. Accordingly, for a grating made up of 10 to 15 periods, the total length is of the order of 8 mm to 12 mm. For a frequency spacing of the order of 50 GHz, the total length is doubled, to 16 mm to 24 mm.

The grating can advantageously have a pitch that is not constant over the sampling period, in which case it is referred to as a chirped grating. A chirped grating can be very useful for modal stabilization of the laser, as indicated in document [3].

For ease of fabrication it is preferable to produce the sampled grating on a fiber, as shown in part A of FIG. 3, or on a silica or polymer waveguide, as shown in part B of FIG. 3. The Bragg grating samples 31, 33 can be produced by direct exposure in the case of a fiber or a silica or polymer waveguide. In particular, in the case of fibers or silica guides, in addition to the well known advantages of such guides (low losses, proven technologies, reliability), it should be noted that the optical index of the guide can be adjusted continuously by a procedure of uniform illumination of the guide. This adjustment of the index n allows fine adjustment of the spacing Δλpeak of the wavelengths of the reflectivity peaks.

The sampled grating can also be integrated onto an InP guide, as shown in part C of FIG. 3. Note, however, that the necessary lengths (several mm) for producing such gratings can lead to real difficulties with practical implementation. A method that is described next with reference to FIG. 4 can be used to reduce the length.

The period Λs of the sampled grating 40 consisting of alternating samples of distributed Bragg reflector gratings 31, 33 and Fabry-Pérot cavities is inversely proportional to the spacing of the wavelengths corresponding to the period of the reflectivity peaks (see above—equation 4). Part A of FIG. 4 shows a waveguide for which the sampled grating 40 has a period Λs corresponding to a spacing of 100 GHz for the reflectivity peaks, for example. That spacing is relative to a grating wavelength λb as shown in part B of FIG. 4.

In the embodiment shown in parts C and D of FIG. 4, samples 31, 33 of a first distributed Bragg reflector sampled grating corresponding to a first Bragg wavelength $\lambda_{B1}$ alternate, with the possible exception of a first or last of them, with samples 31', 33' of a second distributed Bragg reflector sampled grating corresponding to a second Bragg wavelength $\lambda_{B2}$ different from $\lambda_{B1}$. In the embodiment shown in part C of FIG. 4, the samples of the second grating are at the center of the spaces between two samples of the first distributed Bragg reflector grating. There is thus obtained, with the same waveguide length, half the spacing between consecutive wavelengths corresponding to reflectivity peaks of the sampled waveguide. For example, with center wavelengths λb1 and λb2 spaced by 50 GHz, reflectivity peaks spaced by 50 GHz can be obtained although each of the two gratings corresponds to a spacing of 100 GHz between consecutive peaks.

The same principle can be repeated several times and the length of the sampled reflector 40 can therefore be halved several times.

For example, for a system with a spacing of 100 GHz between the consecutive frequencies of reflectivity peaks, traced in an InP waveguide having an optical index of 3.2, if four gratings are traced the sampling period is approximately 120 μm. This yields a 1.2 mm sampled reflector for a grating of ten periods, which becomes feasible on an InP waveguide. One advantage of this embodiment of the sampled grating 40 is that distributed Bragg reflector gratings can be obtained having coupling coefficients greater than 100 cm$^{-1}$ or even 200 cm$^{-2}$, because the number of periods can then be increased.

In the embodiment of sampled gratings just described, equation [4] is applied with a constant value for Λs and with the wavelength of each sampled grating varied to obtain a plurality of sampled gratings interleaved with each other. The benefit of using this equation is that, Λs being constant, regardless of the number of periods of the sampled grating, the successive Bragg gratings are clearly separated from each other and are always at the same distance from each other. If the number of periods of the sampled grating is small, it is possible not only to modify the wavelength λ of each of the interleaved gratings but also to modify the period Λs, to have a plurality of sampled gratings interleaved in each other. This interleaving, with a different value for Λs, can be obtained provided that the traces of the gratings are not superposed at certain points.

As already explained with reference to part C of FIG. 3, the reflective face 13 of the Fabry-Pérot cavity 2 can be etched directly in the semiconductor.

In a laser according to the invention, the simplicity of tuning control and the associated electronics result from the fact that tuning is obtained by acting on a single control parameter, namely the control voltage applied to the second section 6. The speed of tuning is due to the conjugate use of an intrinsically very fast electro-optical effect and the simplicity of the control electronics. In tunable lasers like those described in document [2], in which the tuning frequency is changed by injecting carriers, it is necessary to act on at least two currents in a synchronized manner.

The documents [1], [2], [3], and [4] cited above by way of reference are as follows:

[1] F. Delorme et al., IEE Photonics Technology Letters, Vol. 17, N° 3, p. 269, March 1995.
[2] J. F. Lemieux, M. Tetu, Electronic Letters, Vol. 35, N° 11, p. 904, May 1999.
[3] P. A. Morton et al., "Stable and single mode hybrid laser with high power and narrow linewidth", Applied Physics Letters, Vol. 64, N° 20; 16 May 94.
[4] Morten Ibsen et al., "Sinc-Sampled Fiber Bragg Gratings for Identical Multiple Wavelength Operation", IEEE Photonics Technology Letters, Vol. 10, N° 6, June 1998, p. 842–844.

There is claimed:

1. A wavelength-tunable laser comprising:
a first resonant cavity containing an optical amplifier medium;
a pair of opposed reflector members which define the first resonant cavity;
a second resonant cavity; and
a reflector external to said first resonant cavity delimiting the second resonant cavity thereinbetween, and selectively reflecting for an integer number N of optical frequencies, wherein said two opposed reflector members are not wavelength selective and delimit an amplifying first active section coupled to a phase tuning second active section, each of said two active sections connected to an electrical supply, said second active section having an effective group index that can be adjusted electro-optically as a function of an electrical voltage applied, said first and second active sections having dimensions such that a difference between optical frequencies of any two resonant modes of said first resonant cavity is never equal to a difference between optical frequencies of any two selectively reflected frequencies of said reflector, and second active section modifying an optical length of said first resonant cavity to provide for a selective coincidence of only one optical frequency between the resonant modes of said first resonant cavity and the selectively reflected frequencies of said reflector, wherein the difference between any two adjacent reflected optical frequencies is constant and the reflected optical frequencies are interleaved with consecutive optical frequencies of resonant modes.

2. The wavelength-tunable laser claimed in claim 1 wherein the ratio of the difference between two adjacent optical frequencies of two resonant modes to the difference between two adjacent reflected optical frequencies is equal to N/(N−1).

3. The wavelength-tunable laser claimed in claim 1 wherein said external reflector is a waveguide including at least one sampled Bragg reflector grating optically coupled to said first cavity.

4. The wavelength-tunable laser claimed in claim 3 wherein said waveguide includes a plurality of sampled Bragg reflector gratings and each sample of a first grating, with the possible exception of a first of them or a last of them, is between two consecutive samples of a second grating.

5. The wavelength-tunable laser claimed in claim 1 wherein a sampled Bragg grating of said waveguide has a pitch that is not constant.

6. The wavelength-tunable laser claimed in claim 1 wherein said first cavity is formed between a first outside face of said first section and an outside face of said second section.

7. The wavelength-tunable cavity claimed in claim 1 wherein said first cavity is formed between a first outside face of said first section and an entry face of said reflector.

8. The wavelength-tunable laser claimed in claim 1 wherein the variation of the effective group index of said phase tuning second active section is obtained by a Franz Keldysh effect.

9. The wavelength-tunable laser claimed in claim 1 wherein the variation of the effective group index of said phase tuning second active section is obtained by a Stark quantum confinement electro-optical effect.

10. The wavelength-tunable laser claimed in claim 1 wherein the electrical supply of the second active section modifies the effective group index of said second active section to change the optical length of the first resonant cavity and slip a comb of said resonant modes of said first resonant cavity.

11. A wavelength-tunable laser comprising:
a first resonant cavity containing an optical amplifier medium;
a pair of opposed reflector members which define the first resonant cavity;
a second resonant cavity; and
a reflector external to said first resonant cavity delimiting the second resonant cavity thereinbetween, and selectively reflecting for an integer number N of optical frequencies, wherein said two opposed reflector members are not wavelength selective and delimit an amplifying first active section coupled to a phase tuning second active section, each of said two active sections connected to an electrical supply, said second active section having an effective group index that can be adjusted electro-optically as a function of an electrical voltage applied, said first and second active sections having dimensions such that a difference between optical frequencies of any two resonant modes of said first resonant cavity is never equal to a difference between optical frequencies of any two selectively reflected frequencies of said reflector, and second active section modifying an optical length of said first resonant cavity to provide for a selective coincidence of only one optical frequency between the resonant modes of said first resonant cavity and the selectively reflected frequencies of said reflector, wherein said waveguide includes a plurality of first sampled Bragg reflector gratings corresponding to a first Bragg wavelength and a plurality of second sampled Bragg reflector gratings corresponding to a second Bragg wavelength, wherein each sample of the first and second Bragg gratings, with the possible exception of a first or a last sample of the Bragg gratings, is disposed on the reflector in a repeated pattern comprising one sample of the first Bragg gratings, a first sample of a plurality of third gratings, one sample of the second Bragg gratings, and a second sample of the third gratings.

12. The wavelength-tunable laser claimed in claim 11, wherein each sample of the plurality of second sampled Bragg reflector gratings is disposed half-way between each sample of the first plurality of sampled Bragg reflector gratings.

13. The wavelength-tunable laser claimed in claim 11, wherein the third gratings are Fabry-Perot sections.

14. A method of manufacturing a reflector for a wavelength tunable laser, comprising:

disposing a plurality of sampled first Bragg reflector gratings corresponding to a first Bragg wavelength on the reflector;

disposing a second plurality of sampled Bragg reflector gratings corresponding to a second Bragg wavelength on the reflector, wherein each sample of the first and second Bragg gratings, with the possible exception of a first or a last sample of the Bragg gratings, is disposed on the reflector in a repeated pattern comprising one sample of the first Bragg gratings, a first sample of a plurality of third gratings, one sample of the second Bragg gratings, and a second sample of the third gratings.

15. The method of claim 14, wherein each sample of the second plurality of sampled Bragg reflector gratings is disposed half-way between each sample of the first plurality of sampled Bragg reflector gratings.

16. The method of claim 14, wherein the third gratings are Fabry-Perot sections.

* * * * *